(12) United States Patent
Randall et al.

(10) Patent No.: US 9,490,768 B2
(45) Date of Patent: Nov. 8, 2016

(54) HIGH FREQUENCY BAND PASS FILTER WITH COUPLED SURFACE MOUNT TRANSITION

(71) Applicant: Knowles Cazenovia Inc., Cazenovia, NY (US)

(72) Inventors: Steven Randall, Manlius, NY (US); David Allen Bates, Fayetteville, NY (US)

(73) Assignee: Knowles Cazenovia Inc., Cazenovia, NY (US)

( * ) Notice: Subject to any disclaimer, the term of this patent is extended or adjusted under 35 U.S.C. 154(b) by 129 days.

(21) Appl. No.: 13/926,169

(22) Filed: Jun. 25, 2013

(65) Prior Publication Data

US 2013/0342287 A1  Dec. 26, 2013

Related U.S. Application Data

(60) Provisional application No. 61/663,669, filed on Jun. 25, 2012.

(51) Int. Cl.
| | |
|---|---|
| *H03H 7/01* | (2006.01) |
| *H01P 1/203* | (2006.01) |
| *H01P 5/02* | (2006.01) |

(52) U.S. Cl.
CPC ........ *H03H 7/0161* (2013.01); *H01P 1/20363* (2013.01); *H01P 5/028* (2013.01)

(58) Field of Classification Search
CPC ................ H01P 5/028; H01P 1/203–1/20318
USPC ............................................... 333/204, 24 C
See application file for complete search history.

(56) References Cited

U.S. PATENT DOCUMENTS

| | | | | |
|---|---|---|---|---|
| 5,043,738 | A * | 8/1991 | Shapiro et al. | 343/700 MS |
| 5,093,639 | A * | 3/1992 | Franchi et al. | 333/24 R |
| 5,146,193 | A * | 9/1992 | Sokola | 333/206 |
| 5,335,361 | A * | 8/1994 | Ghaem | 455/501 |
| 5,488,380 | A * | 1/1996 | Harvey | H01Q 21/0087 333/248 |
| 5,710,105 | A * | 1/1998 | Shen | 505/210 |
| 5,750,473 | A * | 5/1998 | Shen | 505/210 |
| 6,317,011 | B1 * | 11/2001 | Barnett et al. | 333/24 C |
| 6,489,865 | B1 * | 12/2002 | Tsujiguchi | H01P 1/20336 333/134 |
| 6,556,109 | B2 * | 4/2003 | Kanba et al. | 333/204 |
| 6,639,484 | B2 * | 10/2003 | Tzuang et al. | 333/21 R |
| 6,831,301 | B2 * | 12/2004 | Murphy et al. | 257/83 |
| 6,882,239 | B2 * | 4/2005 | Miller | H01L 23/48 257/E23.01 |

(Continued)

*Primary Examiner* — Thomas J Hiltunen
(74) *Attorney, Agent, or Firm* — Foley & Lardner LLP

(57) ABSTRACT

A high frequency band pass filter with a coupled surface mount transition is provided, including a filter substrate, circuit connection elements defining input and an output elements provided on a surface of the filter substrate, electronic filter components provided on the first surface of the filter substrate, and impedance matching structures provided on the first surface of the filter substrate between the electronic filter components and the respective input and output elements. Signal connection structures are provided on an opposed surface of the filter substrate, in locations that positionally correspond to respective positions of the input and output elements. The respective signal connection elements are capacitively coupled, through a thickness direction of the filter substrate, to a respective one of the input and output elements on the opposed surface of the filter substrate without the presence of any vertical conductive structures within the filter substrate at the input and the output elements.

8 Claims, 6 Drawing Sheets

(56) References Cited

U.S. PATENT DOCUMENTS

| | | | |
|---|---|---|---|
| 6,891,447 B2* | 5/2005 | Song | H01L 23/48 257/E23.01 |
| 6,995,632 B2* | 2/2006 | Saito et al. | 333/175 |
| 7,245,195 B2* | 7/2007 | Satoh et al. | 333/204 |
| 7,248,134 B2* | 7/2007 | Wu et al. | 333/246 |
| 7,378,924 B2* | 5/2008 | Koizumi et al. | 333/204 |
| 7,479,856 B2* | 1/2009 | Asamura et al. | 333/204 |
| 7,760,045 B2* | 7/2010 | Kawasaki | 333/24 R |
| 7,869,221 B2* | 1/2011 | Knight | G01R 31/3025 361/760 |
| 7,915,699 B2* | 3/2011 | Krishnamoorthy | G02B 6/43 257/414 |
| 8,461,943 B2* | 6/2013 | Kato | 333/238 |
| 8,492,658 B2* | 7/2013 | Gruendler et al. | 174/262 |
| 8,552,821 B2* | 10/2013 | Nagai | H01P 1/2013 310/320 |
| 8,633,784 B2* | 1/2014 | Ihla et al. | 333/24 R |
| 8,725,224 B2* | 5/2014 | Sato et al. | 505/210 |
| 8,855,721 B2* | 10/2014 | Sakurai | H01Q 1/243 307/104 |
| 9,066,198 B2* | 6/2015 | Chung | H04W 4/008 |
| 9,142,475 B2* | 9/2015 | Skinner | H01L 23/32 |
| 9,142,485 B2* | 9/2015 | Grasset | H01L 23/48 |
| 2005/0002448 A1* | 1/2005 | Knight et al. | 375/219 |
| 2005/0134408 A1* | 6/2005 | Hirabayashi | 333/204 |
| 2007/0042542 A1* | 2/2007 | Barth et al. | 438/243 |
| 2013/0207740 A1* | 8/2013 | Kato et al. | 333/33 |
| 2013/0328646 A1* | 12/2013 | Kondou et al. | 333/24 R |
| 2014/0056368 A1* | 2/2014 | Nakayama | H01Q 21/28 375/256 |
| 2014/0292451 A1* | 10/2014 | Zimmerman | 333/24 C |

* cited by examiner

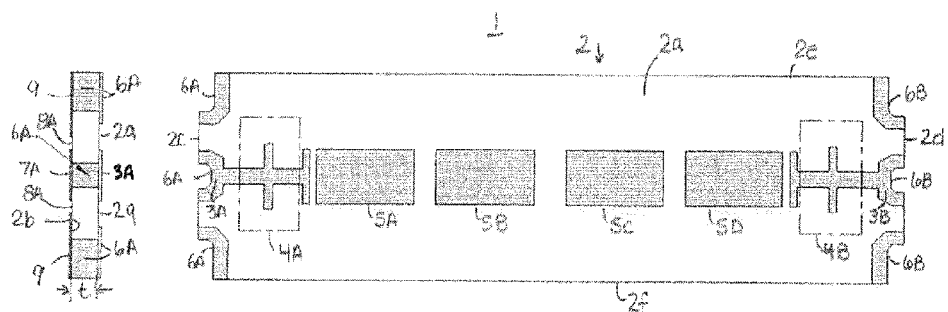
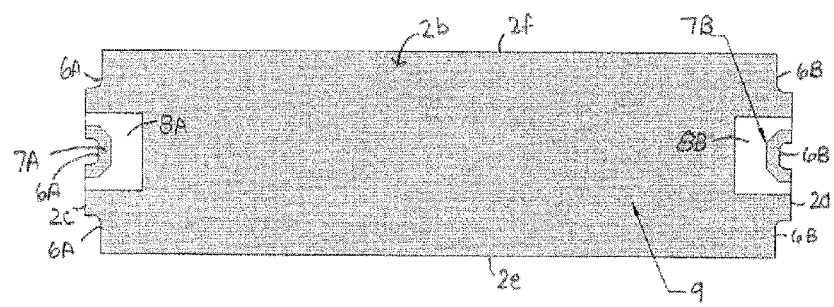

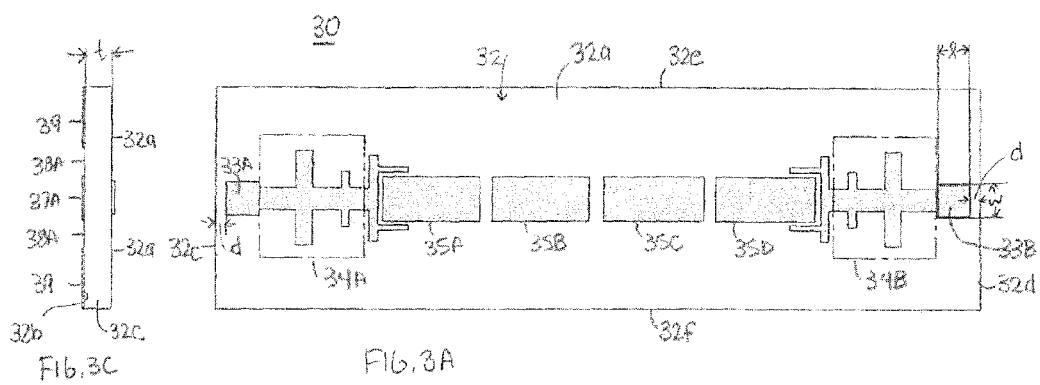
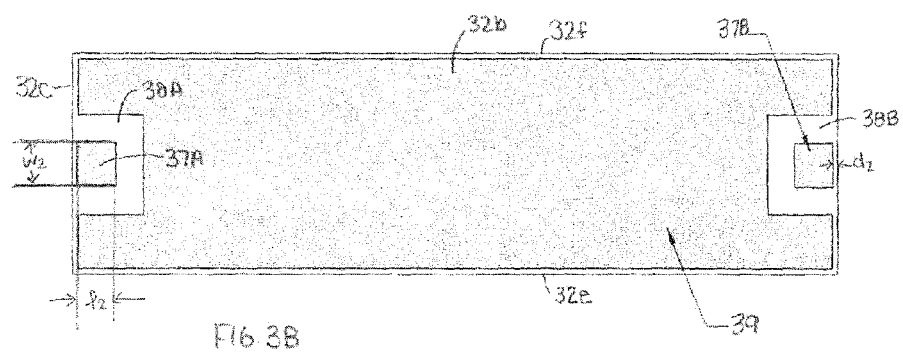

DIMENSIONS: INCH [MM]

HIGH FREQUENCY BAND PASS FILTER WITH COUPLED SURFACE MOUNT TRANSITION

FIELD OF THE INVENTION

The present invention relates in general to high frequency surface mounted passive radio frequency (RF) and microwave devices. In particular, the present invention relates to a high frequency band pass filter (BPF) with a capacitive coupled surface mount transition that eliminates presence of and need for providing vertical conductive structures between the functional layers of the filter located on one surface of a filter substrate and the signal connection structure located on the opposed surface of the filter substrate, which is directly connected to a printed circuit board in a surface mounted application.

BACKGROUND OF THE INVENTION

The terms "surface mount" or "surface mounted" technology (SMT) are used in the electronics industry to describe how electronic components and devices are mounted onto a printed wire circuit board and how the signal, power, and control lines, as may be required, are connected to the subject device. In particular, the subject component or device is epoxied or soldered on top of the supporting circuit board, and thus, surface mounted thereon. Conventional surface mount technology typically involves the use of vertical metallic conductive structures to connect the circuitry on the printed wire board up to the functional layer of the surface mounted device. On passive RF and microwave devices, such as a band pass filter, this connection is accomplished at the RF input and at the RF output of the device.

FIGS. 1A-1C illustrate an example, shown schematically, of a conventional band pass filter (BPF) 1 including a ceramic (e.g., dielectric material) substrate 2 that is surface mounted via solder or epoxy, for example, to a surface of a printed wiring board (PWB) or printed circuit board (PCB) according to known methods. The ceramic substrate 2 of the filter 1 has a first surface 2a (i.e., top surface) on which the electronic components of the filter are formed by various methods known in the art, and an opposed second surface 2b (i.e., a bottom surface) that directly interfaces with the circuitry on the PWB/PCB (see e.g., FIG. 2). While the ceramic substrate 2 is shown as a substantially rectangular body having four sides 2c-2f, it should be understood that the shape of the filter substrate 2 is not strictly limited to the illustrated shape, and other suitable shapes known in the art can also be employed.

In the typical BPF 1 shown, the electronic components of the filter include an RF input 3A formed on the first surface 2a proximate the side 2c of the ceramic material layer 2. The RF input 3A is connected to have physical and electrical ohmic (i.e., metal to metal) contact with at least one of a plurality of vertical metallic conductive structures, such as a metallized half-vias (castellations) 6A formed on the surface 2a and extending along the side 2c through the thickness direction of the ceramic filter substrate 2, the central one of which is also connected to have physical and electrical ohmic contact with the corresponding signal connection structure 7A located on the opposed second surface 2b of the filter substrate 2. In that manner, the signal connection structure 7A is ohmically connected with the RF input 3A of the filter 1.

Similarly, the filter 1 also includes an RF output 3B formed on the first surface 2a proximate the side 2d of the ceramic material layer 2. The RF output 3B is connected to have physical and electrical ohmic contact with a vertical metallic conductive structure, such as a metallized half-vias (castellation) 6B formed on the surface 2d and extending along the side 2d through the thickness direction of the ceramic filter substrate 2, a central one of which is also is connected to have physical and electrical ohmic contact the corresponding signal connection structure 7B located on the opposed second surface 2b of the filter substrate 2. In that manner, the signal connection structure 7B is ohmically connected to the RF output 3B of the filter 1.

In between the respective RF input 3A and output 3B, a first impedance matching structure 4A, a plurality of filter sections (as shown, there are four sections 5A-5D), and a second impedance matching structure 4B are also provided, in that order. The impedance matching structures 4A, 4B are known in the art and are device application specific, as one skilled in the art can readily appreciate. These impedance matching structures are needed to ensure proper signal transmission between the RF input 3A and the filter sections 5A-D, and likewise, from the filter sections to the RF output 3B.

It should also be noted that in the prior art structure shown in FIG. 1, substantially the entire bottom surface 2b of the filter substrate 2 is covered by ground plane 9, with the exception of the signal connection structures 7A, 7B and the electrically insulating isolation areas 8A, 8B surrounding the respective signal connections 7A, 7B. It is particularly important that continuous ground layer be provided at least in portions corresponding to the footprint of the filter section(s) and proximate the RF input/output couplings. In reality, the size constraints of the actual devices make it such that the whole second (bottom) surface of the substrate is essentially covered with the exceptions noted above.

There is a demand, however, to increase the pass band frequencies for surface mounted band pass filters in view of particular applications, such as fixed and mobile Wireless Access, Point to Point, mm-Wave communications. This is due to consumer demand for increased data and the subsequent bandwidth requirements of the related microwave equipment.

At higher frequencies, however, such as those above 30 GHz, the presence of vertical conductive structures (such as a metalized via hole, or castellations 6A, 6B as shown in FIG. 1) causes undesirable side effects by launching parasitic (spurious) modes (energy). That is, vertical conductor structures are particularly efficient with respect to coupling energy into waveguide cavity modes (i.e., radiated fields represented by arrows E in the wave guide enclosure 11, as shown in FIG. 2) in the stop band frequency ranges of the filter, where the reflected energy results in high RF current in the vertical conductor structure and high magnetic fields. As shown in FIG. 2, the band pass filter 1 inside the wave guide enclosure 11 is connected to the printed wiring board 10. However, this mechanism also launches energy which was originally in a quasi-TEM mode transmission lines (e.g. micro-strip or grounded co-planar waveguide) and instead couples some of that energy into transverse electric (TE) or transverse magnetic (TM) waveguide modes. This creates a parallel path for the energy to bypass the filter, thus degrading the overall filter performance. These spurious modes are clearly undesirable, and can, in some instances, effectively render the subject surface mount device inoperable.

Accordingly, it would be desirable, therefore, to provide a high frequency band pass filter that is not subject to the drawbacks associated with the prior art structures that include vertical conductive structures within the ceramic substrate at the input and output. In addition, eliminating the need for vertical conductive structures would simplify the manufacturing process and reduce costs by eliminating machining and metallization materials needed to form the vertical conductive structures.

SUMMARY OF THE INVENTION

It is an object of the present invention to overcome the above-described drawbacks associated with the prior art.

According to one aspect of the present invention, a high frequency passive RF device with a coupled surface mount transition is provided, wherein electromagnetic coupling between signal connection elements on one side of a device substrate and circuit connection elements on a vertically opposed side of the device substrate form an RF signal connection, and vertical conductive structures are excluded from input and output structures thereof. According to one aspect of the present invention, the device is a band pass filter.

According to another aspect of the present invention, a package for a high frequency active RF device with a coupled surface mount transition is provided, wherein electromagnetic coupling between RF signal connection elements on one side of an active device substrate and RF input and output structures on a vertically opposed side of the active device substrate form an RF signal connection, and vertical conductive structures are excluded from the active device in connection with the RF input and output structures.

According to another aspect of the present invention, a high frequency band pass filter with a coupled surface mount transition is provided, comprising a dielectric filter substrate having a first surface and an opposed second surface, circuit connection elements defining an input element and an output element provided on the first surface of the filter substrate and spaced a distance d from respective terminal edges of the first surface of the filter substrate, and electronic filter components provided on the first surface of the filter substrate. Impedance matching structures are also provided on the first surface of the filter substrate and interposed between the input element and the electronic filter structures and between the output element and the electronic filter components, and signal connection elements are provided on the second surface of the filter substrate in locations that positionally correspond to respective positions of the input element and output element on the first surface of the filter substrate. The signal connection elements are respectively separated from a ground plane on the second surface of the filter substrate by an electrically insulating isolation area, and are spaced a distance $d_2$ from respective terminal edges of the second surface of the filter substrate. The respective signal connection elements on the second surface of the filter substrate are capacitively coupled, through a thickness direction of the filter substrate, to a respective one of the input and output elements on the first surface of the filter substrate without the presence of any vertical conductive structures within the filter substrate at the circuit connection elements.

Preferably, the filter substrate comprises a ceramic material having a dielectric constant in a range of 9-25. In addition, the input and output elements preferably have a width dimension w in a range of 0.254 mm to 0.356 mm and a length dimension l in a range of 0.254 mm to 0.356 mm, and the signal connection elements have a width dimension $w_2$ in a range of 0.356 mm to 0.457 mm and a length dimension $l_2$ in a range of 0.304 mm to 0.406 mm. The distance d is preferably in a range of 0.00 mm to 0.127 mm, and the distance $d_2$ is preferably in a range of 0.00 mm to 0.076 mm.

According to another aspect of the present invention, a high frequency band pass filter with a coupled surface mount transition is provided, comprising a filter substrate, circuit connection elements defining an input element and an output element provided on a first surface of the filter substrate, and electronic filter components provided on the first surface of the filter substrate. Impedance matching structures are provided on the first surface of the filter substrate between the electronic filter components and the respective input and output structures, and signal connection elements are provided on an opposed second surface of the filter substrate, in locations that positionally correspond to respective positions of the input and output elements on the first surface of the filter substrate. The respective signal connection elements on the second surface of the filter substrate are capacitively coupled, through a thickness direction of the filter substrate, to a respective one of the input and output elements on the first surface of the filter substrate without the presence of any vertical conductive structures within the filter substrate at the circuit connection elements.

BRIEF DESCRIPTION OF THE DRAWINGS

The following detailed description of the present invention makes reference to the accompanying drawings, in which:

FIGS. 1A-1C are a top schematic plan view, a bottom schematic plan view and a schematic end view of a prior art band pass filter structure;

FIGS. 3A-3C are a top schematic plan view, a bottom schematic plan view and a schematic end view, respectively, of a band pass filter structure according to the present invention;

DETAILED DESCRIPTION OF THE INVENTION

A number of the components of the band pass filter 30 shown in FIGS. 3A-3C and 5A-5C generally correspond to the components of the band pass filter 1 described above. Like reference numbers have been used to designate like components, and repeat descriptions are omitted. The differences between the prior art band pass filter structure 1 and the inventive structure 30 are discussed in detail below.

Figure 2:
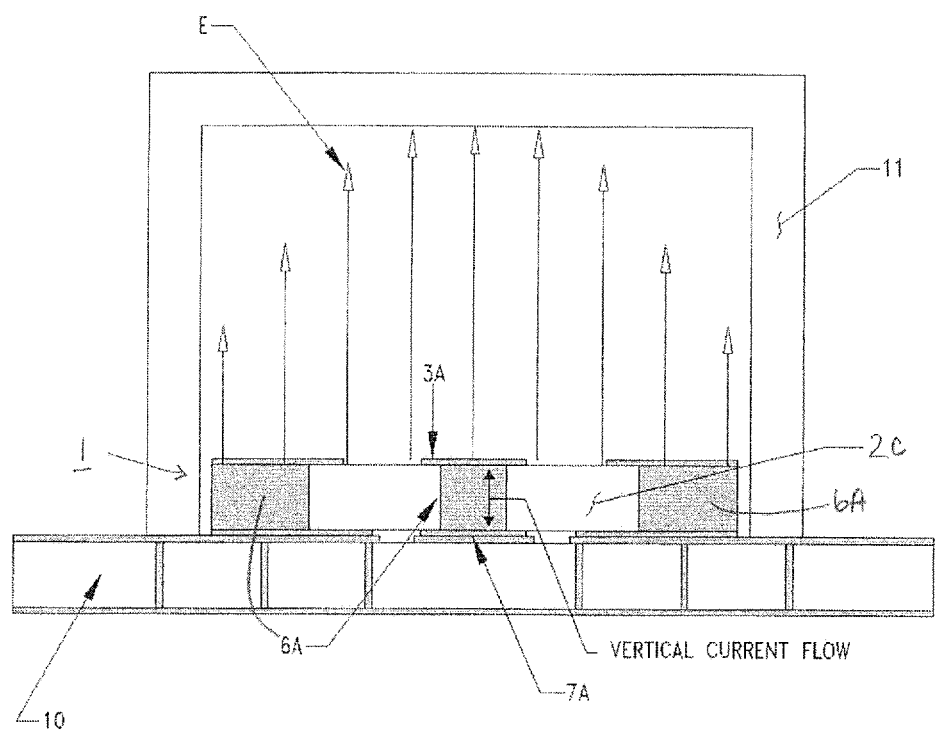
FIG. 2 is a schematic cross-sectional view of the prior art filter of FIG. 1 inside a waveguide.
Figure 4:
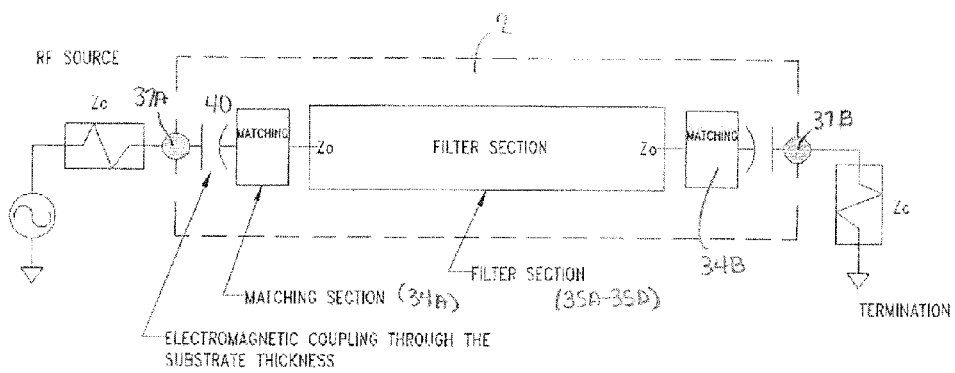
FIG. 4 is an electrical schematic representation of the band bass filter shown in FIGS. 3A-3C.

The present invention successfully eliminates the need for and implementation of vertical conductive structures within the dielectric body of the filter at the input and output signal connection elements. Instead, electromagnetic coupling between the signal connection element on the backside of the ceramic filter substrate, which is attached to the supporting printed wire board, and the coincident circuit connection elements (input and output) on the top surface of the subject filter forms the RF signal connection. This is represented by the capacitor 40 in FIG. 4. The filter topology may include any number of suitable high frequency topologies. In the example shown in FIGS. 3A-3C and 4, an end coupled, four section topology is illustrated. An impedance matching structure (i.e., 34A, 34B in FIG. 3A) is necessary to transform the impedance of the filter, Zo, to the reference impedance of system, Zc.

The impedance matching structures provide the complex conjugate impedance to cancel the capacitive reactance of the coupling capacitance, thereby enabling maximum power transfer (and minimum signal reflections) thru the surface mounted filter. For example, a distributed element circuit structure is employed between the capacitor (i.e., a coupling structure) and the body of the filter to match the impedance of the filter, Zo, to the impedance of the parent circuit board, Zc. Many known electronic components and distributed element techniques are suitable to accomplish this. With no vertical conductive material present, the launching of undesirable spurious waveguide modes is prevented. The fabrication of high frequency band pass filters, as well as other high frequency passive RF devices, utilizing this approach is simplified (by elimination of the signal vias), and precision improved, which results greater consistency of RF performance.

The first impedance matching structure 34A, the filter sections (four as shown, 35A-35D) and the second impedance matching structure 34B, schematically shown in FIG. 3A, are interposed between the RF input 33A and the RF output 33B, in that order. It should be noted, however, that the number of filter sections is not limited to the four shown, and that fewer or additional sections can be employed. One skilled in the art would appreciate that design considerations control the selection of specific filter components and related matching structures. The present invention enables the provision of a high frequency band pass filter without including conventional vertical conductive structures at the input and output for surface mount applications, which has not been achieved prior to the present invention, and therefore ameliorates and/or eliminates the aforementioned undesirable effects attributable to the vertical conductive structures noted above.

The physical structure of the coupled surface mount device according to the present invention and the requisite dimensions are determined primarily in connection with the requirement to mount an RF component to a printed, 50 Ohm transmission line that is printed on any number of commercially available circuit board materials. The predominantly used PWBs for mm-Wave applications have approximate thicknesses in the range of 0.203 mm to 0.305 mm, with dielectric constants of 3.2 to 3.8. A suitable 50 Ohm transmission line is achieved with a conductor, typically about 0.508 mm in width (e.g., a signal conductor). The ground structures necessary to complete the 50 Ohm transmission line structure are positioned on the same surface of the printed wire board, typically within about 0.203 mm to 0.254 mm.

As shown in FIGS. 3A-3C, the BPF 30 includes an RF signal input structure (hereinafter RF input) 33A on the first (i.e., upper) surface 32a of the filter substrate 32 proximate the side 32c thereof. As shown, the RF input 33A is spaced a distance d away from the terminal, peripheral edges of the upper surface 32a and does not extend over the side 32c. Similarly, an RF signal output structure (hereinafter RF output) 33B on the first (i.e., upper) surface 32a of the filter substrate 32 proximate the side 32d thereof is provided on the upper surface 32a of the filter substrate 32 proximate the side 32d thereof, and is spaced a distance d away from the terminal, peripheral edges of the upper surface 32a, and does not extend over the side 32d. The RF input and output 33A, 33B are made of any suitable high conductivity material, examples of which include, but are not limited to copper, gold or silver. The material of the RF signal input and output structures is appropriately selected by those skilled in the art in view of manufacturing considerations and the desired performance characteristics of the resultant microwave device.

Preferably, the RF input and RF output 33A, 33B have a length dimension l, measured in FIG. 3A in a direction parallel to the longitudinal extension direction of the plane of the upper surface 32a of the substrate 32, that is in a range of 0.254 mm to 0.356, and more preferably 0.305 mm. A width dimension w of the RF input and RF output 33A, 33B, measured in FIG. 3A in a direction perpendicular to the length direction 1, and also in the plane of the upper surface of the substrate 32a, is preferably in a range of 0.254 mm to 0.356, and more preferably 0.305 mm. The RF inputs and RF output 33A, 33B are preferably spaced a distance from and do not extend over the respective sides 32c, 32d of the filter substrate 32. For example, the distance d between the terminal, peripheral edges of the upper surface 32a of the filter substrate proximate the sides 32c and 32d and the respective RF input and RF output 33A, 33B is in a range of 0.00 mm to 0.127, and preferably 0.102 mm. Unlike the prior art structure shown in FIG. 1, the inventive band pass filter 30 does not include any vertical conductive structures extending over the substrate edge or passing or through the thickness direction of the filter substrate 32 associated with either the RF input or RF output structures 33A, 33B.

The bottom surface 32b of the filter substrate 32 is different from the prior art, and includes conducting pad structures (i.e., signal connection structures 37A, 37B), which are preferably square or rectangular, for example, and which form the ohmic connections to the 50 Ohm transmission line, and subsequently define the lower plate of the capacitors supporting the electromagnetic coupling to the upper surface of the subject microwave device. The bottom signal connection structures 37A, 37B, have width dimensions, $w_2$, in a range of about 0.356 mm to 0.457 mm, preferably 0.406 mm, and length dimensions, $l_2$, in a range of about 0.304 mm to 0.406, preferably 0.356 mm. The respective signal connections 37A, 37B are surrounded by the electrically insulating isolation areas 38A, 38B. The isolation areas 38A, 38B preferably define a gap having dimensions in a range of about 0.203 mm to 0.305 mm, preferably 0.254 mm, between the peripheral edges of the respective signal connection structures and peripheral portions of the ground plane 39. The signal connections 37A, 37B are also spaced a distance $d_2$ away from the terminal, peripheral edges of the bottom surface 32b and do not extend over the sides 32c, 32d of the filter substrate 32. Preferably, the distance $d_2$ is in a range of 0.00 mm to 0.076 mm, more preferably 0.050 mm. The locations of the signal connections 37A, 37B on the bottom surface 32b positionally correspond to (i.e., are coincident with) the locations of the respective RF input and output connections 33A, 33B on the upper surface 32a.

Suitable substrate materials include those typically employed in the design of planar, mm-Wave, surface mount filters, and include Alumina, or other ceramic materials which are rigid, have a smooth surface roughness of ~0.1 um or better, have a low loss tangent, preferably less than 0.001 at the frequency of use, and which exhibit dielectric constant temperature stability, preferably less than 50 ppm/° C., such as materials from Dielectric Laboratories, Inc., known as PG and CF, for example. In the context of the present invention, the substrate material preferably has a dielectric constant in a range of 9 to 25. Commercially available materials are generally available in thickness of 0.203 mm to 0.635 mm, for example. The thickness t of the filter substrate 32, in conjunction with the dielectric constant of the substrate material, is important with respect to achieving the desired filter functionality at the design operating frequency and performance in connection with the associated matching structures, as known in the art. The preferred thickness in the context of the present invention is 0.254 mm. Filter substrate material parameters, including thickness and dielectric constant, must be selected based on the intended performance requirements of the filter, in view of the known industry standards for a particular frequency range. Adjustment of the inventive electromagnetic coupling is accomplished by adjusting the dimensions of the input and output structures 33A and 33B.

The dimensional ranges noted above are important to ensure that effective capacitive coupling is achieved through the thickness direction t of the filter substrate 32 between the signal connections 37A, 37B on the bottom surface 32b of the filter substrate and RF input/output 33A, 33B (and the plurality of filter components) on the upper surface 32a of the filter substrate without providing any direct coupling through vertical metallic conductive structures. In that manner, the present invention eliminates the presence of vertical conductive structures within the filter at the input and the output thereof.

WORKING EXAMPLE

Figures 5A, 5C:
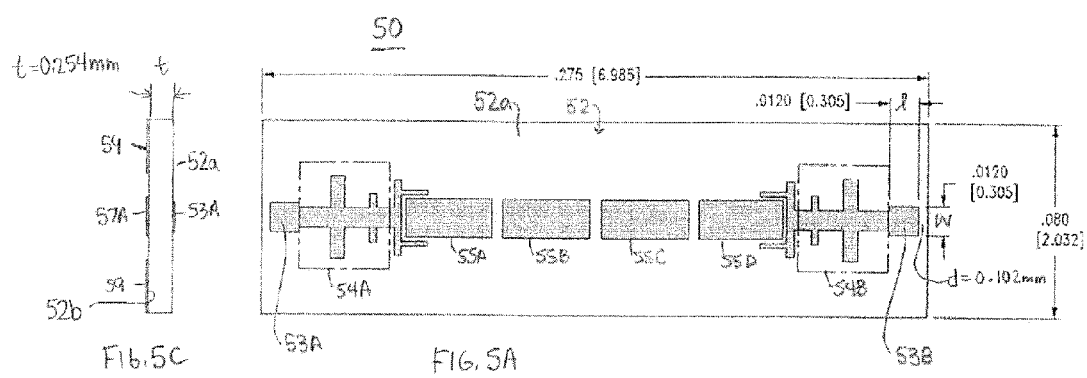
FIGS. 5A-5C are a top schematic plan view, a bottom schematic plan view and a schematic end view, respectively, of a working example of a 40.5 to 44.5 GHz band pass filter according to the present invention.
Figure 5B:
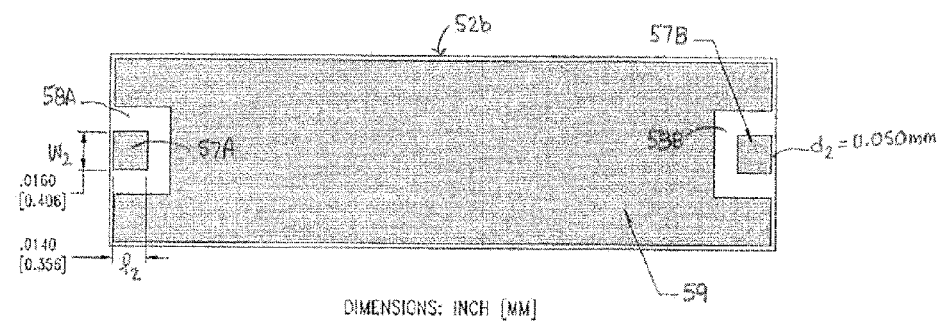

FIGS. 5A-5C represent a filter structure according to a working example of the present invention, and correspond to the general structure shown in FIGS. 3A-3C, but include the specific dimensional attributes of the working example. Like components have been designated with like reference numbers, and repeat descriptions of like components are omitted.

The band pass filter 50 includes RF signal input and output structures 53A, 53B, impedance matching structures 54A, 54B and filter sections 55A-55D on the upper surface 52a of the filter substrate 52. The filter substrate 52 is made of a dielectric ceramic composition having a dielectric constant of 13. The impedance matching structures of the working example specifically include two pairs of open circuit terminated transmission lines, stubs, placed strategically between the RF signal input and output structures 53A and 53B. The bottom surface 52b of the filter substrate 52 includes the signal connection structures 57A, 57B, the electrically insulating isolation areas 58A, 58B and the ground plane 59. The specific dimensions of the respective portions are shown in FIGS. 5A and 5B.

Figure 5D:
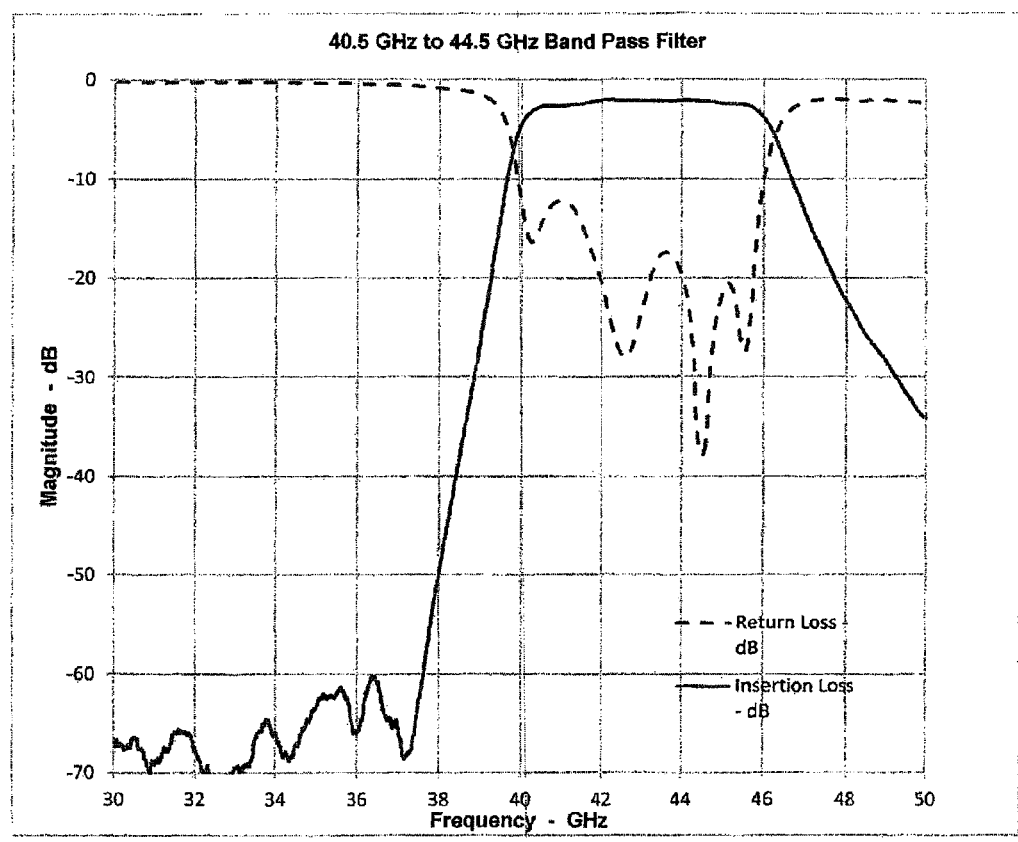
FIG. 5D is a graphic representation of the insertion loss and return loss results measured in connection with the working example.

FIG. 5D shows the insertion loss and return loss results of the filter 50 according to the working example, which were achieved by mounting the filter 50 shown in of FIG. 5A-5C onto a test circuit board (e.g., 0.010 inch thick microwave circuit board material) using solder reflow techniques, and standard two-port s-parameter measurements were performed.

FIG. 5D shows that the filter 50 according to the working example exhibited the desired filter performance characteristics in the desired frequency range without direct ohmic contact between the signal connection structures 57A, 57B on the bottom surface 52b of the filter substrate 52 and the RF input/output structures 53A, 53B on the upper surface 52a of the filter substrate 52. It can be seen from the insertion loss plot and the return loss plot from 30 GHz to 50 GHz there is no evidence of spurious modes being launched.

The present invention thus provides an effective and novel solution to the drawbacks associated with conventional surface mounted band pass filters, which was heretofore unknown in the art. While the present invention is described primarily in the context of high frequency band pass filters, it should be noted that the specific coupling mechanism embodied by the present invention can also be applied in connection with other high frequency, passive and active RF devices.

Figure 6:
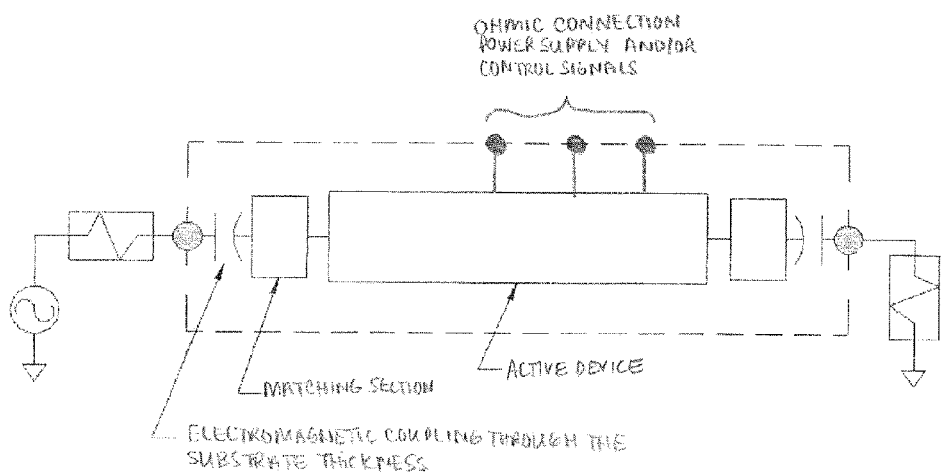
FIG. 6 is an electrical schematic representation a package for an active high frequency, narrow band device according to another aspect of the present invention.

For example, it should be understood by skilled artisans that the present invention is also applicable with respect to both passive and active RF circuits with one or more RF ports, including but not limited to power dividers, couplers, mixers, and frequency multipliers, etc. For instance, FIG. 6 shows an example of an electrical schematic representation a package for an active high frequency, narrow band device according to another aspect of the present invention. Electrical power is provided to the active components by direct ohmic contact, while capacitive coupling between the bottom signal connection structures and the RF input/output of the active device is achieved according to the present invention.

One skilled in the art would be able to modify such devices, based on the disclosure in the present application, to include a coupled surface mount transition, rather than vertical conductive structures, taking into account the necessary design parameters of the specific intended device.

While the present invention has been particularly shown and described with reference to the preferred mode as illustrated in the drawings, it will be understood by one skilled in the art that various changes in detail may be effected therein without departing from the spirit and scope of the invention as defined by the claims.

What is claimed is:

1. A high frequency band pass filter with a coupled surface mount transition, comprising:
    a dielectric filter substrate having a first surface and an opposed second surface;
    circuit connection elements defining an input element and an output element provided on the first surface of the filter substrate and spaced a distance d from respective terminal edges of the first surface of the filter substrate;
    electronic filter components provided on the first surface of the filter substrate and extending along a longitudinal extension axis of the filter substrate from a first point proximate a first end of the filter substrate to a second point proximate a second end of the filter substrate;
    impedance matching structures provided on the first surface of the filter substrate and interposed between the input element and the electronic filter components and between the output element and the electronic filter components;
    at least one protrusion integrally connected to each impedance matching structure and extending to a position between the first and second points; and
    signal connection elements provided on the second surface of the filter substrate in locations that positionally correspond to respective positions of the input element and output element on the first surface of the filter substrate, the signal connection elements respectively separated from a ground plane on the second surface of the filter substrate by an electrically insulating isolation area, and being spaced a distance $d_2$ from respective terminal edges of the second surface of the filter substrate;

whereby the respective signal connection elements on the second surface of the filter substrate are capacitively coupled, through a thickness direction of the filter substrate, to a respective one of the input and output elements on the first surface of the filter substrate without the presence of any vertical conductive structures within the filter substrate at the circuit connection elements.

2. The high frequency band pass filter with a coupled surface mount transition according to claim 1, wherein the filter substrate comprises a ceramic material having a dielectric constant in a range of 9-25.

3. The high frequency band pass filter with a coupled surface mount transition according to claim 1, wherein the input and output elements have a width dimension in a range of 0.254 mm to 0.356 mm and a length dimension in a range of 0.254 mm to 0.356 mm.

4. The high frequency band pass filter with a coupled surface mount transition according to claim 1, wherein the signal connection elements have a width dimension in a range of 0.356 mm to 0.457 mm and a length dimension in a range of 0. 304 mm to 0.406 mm.

5. The high frequency band pass filter with a coupled surface mount transition according to claim 1, wherein the distance d is in a range of 0.00 mm to 0.127 mm.

6. The high frequency band pass filter with a coupled surface mount transition according to claim 1, wherein the distance $d_2$ is in a range of 0.00 mm to 0.076 mm.

7. The high frequency band pass filter with a coupled surface mount transition according to claim 1, wherein the protrusion extends in parallel to the longitudinal extension axis of the substrate.

8. A high frequency band pass filter with a coupled surface mount transition, comprising:

a filter substrate;

circuit connection elements defining an input element and an output element provided on a first surface of the filter substrate;

electronic filter components provided on the first surface of the filter substrate and extending along a longitudinal extension axis of the filter substrate from a first point proximate a first end of the filter substrate to a second point proximate a second end of the filter substrate;

impedance matching structures provided on the first surface of the filter substrate between the electronic filter components and the respective input and output elements;

at least one protrusion integrally connected to each impedance matching structure and extending to a position between the first and second points; and signal connection elements provided on an opposed second surface of the filter substrate, in locations that positionally correspond to respective positions of the input and output elements on the first surface of the filter substrate;

whereby the respective signal connection elements on the second surface of the filter substrate are capacitively coupled, through a thickness direction of the filter substrate, to a respective one of the input and output elements on the first surface of the filter substrate without the presence of any vertical conductive structures within the filter substrate at the circuit connection elements.

* * * * *

UNITED STATES PATENT AND TRADEMARK OFFICE
CERTIFICATE OF CORRECTION

PATENT NO. : 9,490,768 B2  
APPLICATION NO. : 13/926169  
DATED : November 8, 2016  
INVENTOR(S) : Randall et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 161 days.

Signed and Sealed this

Twenty-fifth Day of September, 2018

Andrei Iancu  
*Director of the United States Patent and Trademark Office*